(12) United States Patent
Fuyuki et al.

(10) Patent No.: US 10,158,035 B2
(45) Date of Patent: Dec. 18, 2018

(54) SEMICONDUCTOR STACK, LIGHT-RECEIVING DEVICE, AND METHOD FOR PRODUCING SEMICONDUCTOR STACK

(71) Applicant: SUMITOMO ELECTRIC INDUSTRIES, LTD., Osaka-shi, Osaka (JP)

(72) Inventors: Takuma Fuyuki, Itami (JP); Suguru Arikata, Itami (JP); Takashi Kyono, Itami (JP); Yusuke Yoshizumi, Itami (JP); Katsushi Akita, Itami (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 15/566,672

(22) PCT Filed: Apr. 8, 2016

(86) PCT No.: PCT/JP2016/061524
§ 371 (c)(1),
(2) Date: Oct. 13, 2017

(87) PCT Pub. No.: WO2016/171009
PCT Pub. Date: Oct. 27, 2016

(65) Prior Publication Data
US 2018/0122971 A1   May 3, 2018

(30) Foreign Application Priority Data

Apr. 22, 2015 (JP) ................................. 2015-087850
Apr. 22, 2015 (JP) ................................. 2015-087851

(51) Int. Cl.
*H01L 31/18* (2006.01)
*H01L 31/0352* (2006.01)
(Continued)

(52) U.S. Cl.
CPC ............ *H01L 31/035236* (2013.01); *H01L 27/14652* (2013.01); *H01L 31/02161* (2013.01);
(Continued)

(58) Field of Classification Search
CPC ........... H01L 31/035236; H01L 31/109; H01L 31/1844
See application file for complete search history.

(56) References Cited

U.S. PATENT DOCUMENTS

2002/0105010 A1\* 8/2002 Ono .................... H01L 31/1035
257/184
2012/0128016 A1\* 5/2012 Adachi .................. B82Y 20/00
372/43.01
(Continued)

FOREIGN PATENT DOCUMENTS

JP   2000-332287     11/2000
JP   2002-314118 A   10/2002
(Continued)

OTHER PUBLICATIONS

Sidhu et al., "A Long-Wavelength Photodiode on InP Using Lattice-Matched GaInAs—GaAsSb Type-II Quantum Wells," IEEE Photonics Technology Letters, Dec. 2005, vol. 7, No. 12, pp. 2715-2717.
(Continued)

*Primary Examiner* — Jaehwan Oh
(74) *Attorney, Agent, or Firm* — Oliff PLC

(57) ABSTRACT

A semiconductor stack includes a first-conductivity-type layer of a first conductivity type, the first-conductivity-type layer being formed of a III-V compound semiconductor; a quantum well light-receiving layer formed of a III-V compound semiconductor; and a second-conductivity-type layer of a second conductivity type different from the first con-
(Continued)

ductivity type, the second-conductivity-type layer being formed of a III-V compound semiconductor. The first-conductivity-type layer, the quantum well light-receiving layer, and the second-conductivity-type layer are stacked in this order. The quantum well light-receiving layer has a thickness of 0.5 μm or more. The quantum well light-receiving layer has a carrier concentration of $1\times10^{16}$ cm$^{-3}$ or less.

16 Claims, 12 Drawing Sheets

(51) Int. Cl.
    *H01L 27/146*     (2006.01)
    *H01L 31/0304*    (2006.01)
    *H01L 31/109*     (2006.01)
    *H01L 31/0216*    (2014.01)

(52) U.S. Cl.
    CPC ...... *H01L 31/03046* (2013.01); *H01L 31/109* (2013.01); *H01L 31/1844* (2013.01); *H01L 31/1868* (2013.01)

(56) References Cited

U.S. PATENT DOCUMENTS

| | | | | |
|---|---|---|---|---|
| 2012/0298957 | A1* | 11/2012 | Iguchi | H01L 27/1464 257/21 |
| 2013/0048838 | A1* | 2/2013 | Mori | B82Y 20/00 250/214.1 |
| 2013/0248821 | A1* | 9/2013 | Miura | B82Y 20/00 257/21 |
| 2013/0313521 | A1* | 11/2013 | Akita | H01L 31/035209 257/21 |
| 2014/0008614 | A1* | 1/2014 | Fujii | H01L 21/02392 257/21 |
| 2014/0054545 | A1* | 2/2014 | Akita | H01L 31/035236 257/21 |
| 2015/0115222 | A1* | 4/2015 | Kyono | H01L 31/035236 257/21 |

FOREIGN PATENT DOCUMENTS

| | | |
|---|---|---|
| JP | 2003-060223 A | 2/2003 |
| JP | 3508519 B2 | 3/2004 |
| JP | 2006-245163 A | 9/2006 |
| JP | 2011-192838 A | 9/2011 |
| JP | 2011-204919 A | 10/2011 |
| JP | 2012-094761 A | 5/2012 |
| JP | 2012-114464 A | 6/2012 |
| JP | 2012-244124 A | 12/2012 |
| JP | 2013-251341 A | 12/2013 |
| JP | 2014-003069 A | 1/2014 |
| JP | 2014-067830 A | 4/2014 |
| JP | 2014-225578 A | 12/2014 |
| JP | 5691205 B2 | 4/2015 |

OTHER PUBLICATIONS

Forrest, Stephen R., "Performance of InxGa1-xAsyP1-y Photodiodes with Dark Current Limited by Diffusion, Generation Recombination, and Tunneling," IEEE Journal of Quantum Electronics, Feb. 1981, vol. QE-17, No. 2, pp. 217-226.

* cited by examiner

SEMICONDUCTOR STACK, LIGHT-RECEIVING DEVICE, AND METHOD FOR PRODUCING SEMICONDUCTOR STACK

TECHNICAL FIELD

The present invention relates to a semiconductor stack, a light-receiving device, and a method for producing a semiconductor stack.

This application claims priorities based on Japanese Patent Application No. 2015-087850 filed on Apr. 22, 2015 and Japanese Patent Application No. 2015-087851 filed on Apr. 22, 2015, and the entire contents of these Japanese Patent Applications are herein incorporated by reference.

BACKGROUND ART

Semiconductor stacks having a structure in which semiconductor layers formed of a III-V compound semiconductor are formed on a substrate formed of a III-V compound semiconductor can be used for producing a light-receiving device designed for light in an infrared region. Specifically, for example, an infrared light-receiving device can be produced by sequentially stacking, on a substrate formed of a III-V compound semiconductor, a buffer layer, a quantum well light-receiving layer, and a contact layer that are formed of a III-V compound semiconductor and further forming appropriate electrodes. Of such light-receiving devices, a photodiode that has a cutoff wavelength of 2 µm to 5 µm has been reported (e.g., refer to NPL 1). Furthermore, a structure (nip structure) in which an n-type layer is disposed on a side of the quantum well light-receiving layer opposite to a substrate and a first electrode is formed so as to be in contact with the n-type layer, and a p-type layer is disposed on the substrate side and a second electrode is formed so as to be in contact with the p-type layer has been proposed in order to, for example, improve the sensitivity (e.g., refer to PTL 1 to PTL 3). In some literature, theoretical calculation has been conducted on the dark current components of a light-receiving device (e.g., refer to NPL 2).

CITATION LIST

Patent Literature

PTL 1: Japanese Unexamined Patent Application Publication No. 2011-192838
PTL 2: Japanese Unexamined Patent Application Publication No. 2002-314118
PTL 3: Japanese Unexamined Patent Application Publication No. 2006-245163

Non Patent Literature

NPL 1: R. Sidhu, et al., "A Long-Wavelength Photodiode on InP Using Lattice-Matched GaInAs—GaAsSb Type-II Quantum Wells", IEEE PHOTONICS TECHNOLOGY LETTERS, VOL. 17, NO. 12, DECEMBER 2005, p. 2715-2717
NPL 2: S. R. FORREST, "Performance of $In_xGa_{1-x}As_yP_{1-y}$ Photodiodes with Dark Current Limited by Diffusion, Generation Recombination, and Tunneling", IEEE JOURNAL OF QUANTUM ELECTRONICS, VOL. QE-17, NO. 2, FEBRUARY 1981, p. 217-226

SUMMARY OF INVENTION

Technical Problem

The light-receiving device including semiconductor layers formed of a III-V compound semiconductor sometimes poses a problem in that the sensitivity does not sufficiently improve and the dark current increases. Accordingly, it is one of objects to provide a semiconductor stack, a light-receiving device, and a method for producing a semiconductor stack that enable an improvement in the sensitivity of a light-receiving device including semiconductor layers formed of a III-V compound semiconductor and a reduction in the dark current.

Solution to Problem

A semiconductor stack according to the present invention includes a first-conductivity-type layer of a first conductivity type, the first-conductivity-type layer being formed of a III-V compound semiconductor; a quantum well light-receiving layer formed of a III-V compound semiconductor; and a second-conductivity-type layer of a second conductivity type different from the first conductivity type, the second-conductivity-type layer being formed of a III-V compound semiconductor. The first-conductivity-type layer, the quantum well light-receiving layer, and the second-conductivity-type layer are stacked in this order. The quantum well light-receiving layer has a thickness of 0.5 µm or more. The quantum well light-receiving layer has a carrier concentration of $1 \times 10^{16}$ $cm^{-3}$ or less.

A method for producing a semiconductor stack according to the present invention includes a step of forming a first-conductivity-type layer of a first conductivity type, the first-conductivity-type layer being formed of a III-V compound semiconductor; a step of forming a quantum well light-receiving layer formed of a III-V compound semiconductor; and a step of forming a second-conductivity-type layer of a second conductivity type different from the first conductivity type, the second-conductivity-type layer being formed of a III-V compound semiconductor. The step of forming a first-conductivity-type layer, the step of forming a quantum well light-receiving layer, and the step of forming a second-conductivity-type layer are performed in this order, and the first-conductivity-type layer, the quantum well light-receiving layer, and the second-conductivity-type layer are stacked in this order. The quantum well light-receiving layer is formed so as to have a thickness of 0.5 µm or more and a carrier concentration of $1 \times 10^{16}$ $cm^{-3}$ or less.

Advantageous Effects of Invention

According to the semiconductor stack and the method for producing a semiconductor stack, the sensitivity of a light-receiving device including semiconductor layers formed of a III-V compound semiconductor can be improved and the dark current can also be reduced.

DESCRIPTION OF EMBODIMENTS

Figure 1:
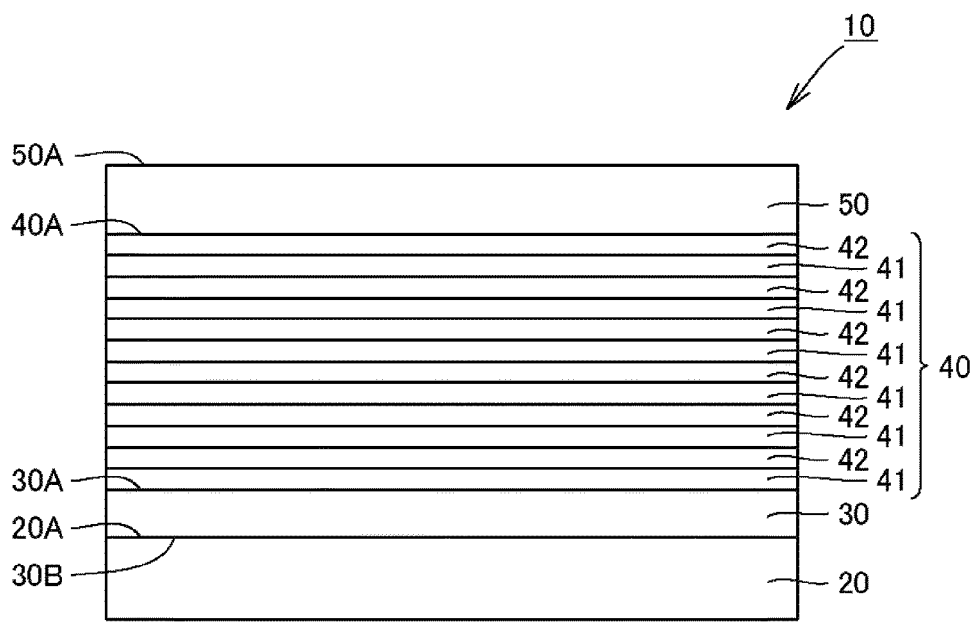
FIG. 1 is a schematic sectional view illustrating a structure of a semiconductor stack according to a first embodiment.

Description of Embodiments of the Present Invention

First, embodiments of the present invention will be listed and described. A semiconductor stack according to this application includes a first-conductivity-type layer of a first conductivity type, the first-conductivity-type layer being formed of a III-V compound semiconductor; a quantum well light-receiving layer formed of a III-V compound semiconductor; and a second-conductivity-type layer of a second conductivity type different from the first conductivity type, the second-conductivity-type layer being formed of a III-V compound semiconductor. The first-conductivity-type layer, the quantum well light-receiving layer, and the second-conductivity-type layer are stacked in this order. The quantum well light-receiving layer has a thickness of 0.5 µm or more. The quantum well light-receiving layer has a carrier concentration of $1 \times 10^{16}$ cm$^{-3}$ or less.

The present inventors have conducted studies on the causes in which the sensitivity does not sufficiently improve and the dark current increases in a light-receiving device including semiconductor layers formed of a III-V compound semiconductor. As a result, they have found that the decrease in sensitivity and the increase in dark current are dependent on the thickness of a quantum well light-receiving layer and the carrier concentration of a quantum well light-receiving layer. Specifically, by controlling the carrier concentration to $1 \times 10^{16}$ cm$^{-3}$ or less, the dark current can be reduced to its permissible range. Furthermore, when the above carrier concentration is satisfied, a sufficient depletion layer width is achieved at a typical operating voltage. By setting the thickness of the quantum well light-receiving layer to 0.5 µm or more under the conditions in which a sufficient depletion layer width is achieved, the sensitivity can be controlled to its permissible range.

In the semiconductor stack according to this application, the quantum well light-receiving layer has a carrier concentration of $1 \times 10^{16}$ cm$^{-3}$ or less and a thickness of 0.5 µm or more. Therefore, by producing a light-receiving device using the semiconductor stack according to this application, the sensitivity of the light-receiving device including semiconductor layers formed of a III-V compound semiconductor can be improved and the dark current can be reduced.

In the above semiconductor stack, the quantum well light-receiving layer may have a thickness of 1.5 µm or more. The quantum well light-receiving layer may have a carrier concentration of $1 \times 10^{15}$ cm$^{-3}$ or less. This can further improve the sensitivity of the light-receiving device and reduce the dark current.

In the above semiconductor stack, the quantum well light-receiving layer may have a thickness of 2.0 µm or more. The quantum well light-receiving layer may have a carrier concentration of $7 \times 10^{14}$ cm$^{-3}$ or less. This can further improve the sensitivity of the light-receiving device and reduce the dark current.

In the quantum well light-receiving layer of the above semiconductor stack, a first-conductivity-type impurity that generates a carrier of the first conductivity type and a second-conductivity-type impurity that generates a carrier of the second conductivity type may each have a concentration of $1 \times 10^{16}$ cm$^{-3}$ or less.

Since the carrier concentration is a difference between the p-type impurity concentration and the n-type impurity concentration, the carrier concentration does not exceed an impurity concentration. By controlling both the concentrations of the first-conductivity-type impurity and the second-conductivity-type impurity to $1 \times 10^{16}$ cm$^{-3}$ or less, the above carrier concentration of the quantum well light-receiving layer can be easily achieved. This can further improve the sensitivity of the light-receiving device and reduce the dark current.

In the above semiconductor stack, when the first-conductivity-type impurity is a p-type impurity, the first-conductivity-type layer is a p-type layer. A low p-type impurity concentration region having a p-type impurity concentration of $5 \times 10^{17}$ cm$^{-3}$ or less may be formed in a region including a first main surface that is a main surface of the p-type layer near the quantum well light-receiving layer, and the low p-type impurity concentration region may have a thickness of 50 nm or more. By forming the low p-type impurity concentration region having a thickness of 50 nm or more, the mixing of a p-type impurity into the quantum well light-receiving layer can be suppressed. This can further improve the sensitivity of the light-receiving device and reduce the dark current.

When a semiconductor stack is produced by setting the first conductivity type as a p-type and the second conductivity type as an n-type, a p-type layer is formed on a substrate and then a quantum well light-receiving layer is formed. The formation of the p-type layer and the formation of the quantum well light-receiving layer can be continuously performed in the same furnace by changing a source gas. A p-type impurity that has been introduced during the formation of the p-type layer for the purpose of addition to the p-type layer is left in the furnace, and thus the p-type impurity is easily mixed in the quantum well light-receiving layer during the formation of the quantum well light-receiving layer. Furthermore, after the formation of the quantum well light-receiving layer, an n-type layer is formed. Herein, a stack obtained by forming the quantum well light-receiving layer on the p-type layer is heated to a temperature suitable for formation of the n-type layer. This heating facilitates the diffusion of a p-type impurity from the p-type layer to the quantum well light-receiving layer. By forming a low p-type impurity concentration region having a p-type impurity concentration of $5\times10^{17}$ cm$^{-3}$ or less and a thickness of 50 nm or more in a region including a first main surface that is a main surface of the p-type layer near the quantum well light-receiving layer, the mixing and diffusion of the p-type impurity into the quantum well light-receiving layer can be suppressed. For example, the p-type impurity concentration in the quantum well light-receiving layer can be easily controlled to $5\times10^{15}$ cm$^{-3}$ or less. This can further improve the sensitivity of the light-receiving device and reduce the dark current.

In the quantum well light-receiving layer of the above semiconductor stack, one of a first-conductivity-type impurity that generates a carrier of the first conductivity type and a second-conductivity-type impurity that generates a carrier of the second conductivity type may be contained in a concentration of more than $1\times10^{16}$ cm$^{-3}$, and the other of the first-conductivity-type impurity and the second-conductivity-type impurity may be contained in such a concentration that a difference in concentration between the one and the other is $1\times10^{16}$ cm$^{-3}$ or less.

Even in the case where one of the p-type impurity and the n-type impurity is contained in the quantum well light-receiving layer in a concentration of more than $1\times10^{16}$ cm$^{-3}$, the above carrier concentration of the quantum well light-receiving layer can be achieved by introducing the other of the p-type impurity and the n-type impurity into the quantum well light-receiving layer.

In the above semiconductor stack, one of the first-conductivity-type impurity and the second-conductivity-type impurity may be at least one selected from the group consisting of Si (silicon), S (sulfur), Se (selenium), Ge (germanium), and Te (tellurium), and the other may be at least one selected from the group consisting of Zn (zinc), Be (beryllium), Mg (magnesium), and C (carbon). These impurities are suitable as the p-type impurity or n-type impurity contained in the first-conductivity-type layer and second-conductivity-type layer formed of a III-V compound semiconductor.

In the above semiconductor stack, the quantum well light-receiving layer may have a type II quantum well structure. In this case, the semiconductor stack is easily made suitable for a light-receiving device designed for light in an infrared region.

In the above semiconductor stack, the quantum well light-receiving layer may have a multiple quantum well structure including pairs of In$_x$Ga$_{1-x}$As (indium gallium arsenide, x is 0.38 or more and 1 or less) layers and GaAs$_{1-y}$Sb$_y$ (gallium arsenide antimonide, y is 0.36 or more and 1 or less) layers or pairs of Ga$_{1-u}$In$_u$N$_v$As$_{1-v}$ (gallium indium nitride arsenide, u is 0.4 or more and 0.8 or less, v is more than 0 and 0.2 or less) layers and GaAs$_{1-y}$Sb$_y$ (y is 0.36 or more and 0.62 or less) layers. In this case, the semiconductor stack is easily made suitable for a light-receiving device designed for light in a near-infrared region to a mid-infrared region.

The above semiconductor stack may further include a substrate located on an opposite side of the first-conductivity-type layer from the quantum well light-receiving layer. The substrate may be formed of GaAs (gallium arsenide), GaP (gallium phosphide), GaSb (gallium antimonide), InP (indium phosphide), InAs (indium arsenide), InSb (indium antimonide), AlSb (aluminum antimonide), or AlAs (aluminum arsenide). In this case, the multiple quantum well structure suitable for detection of light in a near-infrared region to a mid-infrared region can be easily employed as the quantum well light-receiving layer.

In the above semiconductor stack, the first-conductivity-type layer, the quantum well light-receiving layer, and the second-conductivity-type layer may be stacked without forming a regrowth interface. Thus, the dark current can be reduced with more certainty. The regrowth interface is an interface at which at least one element selected from oxygen, hydrogen, and carbon accumulates.

In the above semiconductor stack, an oxygen concentration, a carbon concentration, and a hydrogen concentration at an interface between the first-conductivity-type layer and the quantum well light-receiving layer and at an interface between the quantum well light-receiving layer and the second-conductivity-type layer may be each $1\times10^{17}$ cm$^{-3}$ or less. Thus, the dark current can be reduced with more certainty.

A light-receiving device according to this application includes the above semiconductor stack and electrodes formed on the semiconductor stack. Since the light-receiving device according to this application includes the above semiconductor stack according to this application, the sensitivity of the light-receiving device according to this application can be improved and the dark current can be reduced.

A method for producing a semiconductor stack according to this application includes a step of forming a first-conductivity-type layer of a first conductivity type, the first-conductivity-type layer being formed of a III-V compound semiconductor; a step of forming a quantum well light-receiving layer formed of a III-V compound semiconductor; and a step of forming a second-conductivity-type layer of a second conductivity type different from the first conductivity type, the second-conductivity-type layer being formed of a III-V compound semiconductor. The step of forming a first-conductivity-type layer, the step of forming a quantum well light-receiving layer, and the step of forming a second-conductivity-type layer are performed in this order, and the first-conductivity-type layer, the quantum well light-receiving layer, and the second-conductivity-type layer are stacked in this order. The quantum well light-receiving layer is formed so as to have a thickness of 0.5 μm or more and a carrier concentration of $1\times10^{16}$ cm$^{-3}$ or less.

In the method for producing a semiconductor stack according to this application, the quantum well light-receiving layer is formed so as to have a thickness of 0.5 μm or more and a carrier concentration of $1\times10^{16}$ cm$^{-3}$ or less. Therefore, by employing the method for producing a semiconductor stack according to this application, a semiconductor stack capable of improving the sensitivity of a light-receiving device including semiconductor layers formed of a III-V compound semiconductor and reducing the dark current can be produced.

In the above method for producing a semiconductor stack, the step of forming a first-conductivity-type layer, the step of forming a quantum well light-receiving layer, and the step of forming a second-conductivity-type layer may be performed so that the first-conductivity-type layer, the quantum well light-receiving layer, and the second-conductivity-type layer are stacked without forming a regrowth interface. Thus, the dark current can be reduced with more certainty.

In the above method for producing a semiconductor stack, the step of forming a first-conductivity-type layer, the step of forming a quantum well light-receiving layer, and the step of forming a second-conductivity-type layer may be performed by a metal-organic vapor phase epitaxy method. Thus, a first-conductivity-type layer, a quantum well light-receiving layer, and a second-conductivity-type layer formed of high-quality crystals are easily formed.

The above method for producing a semiconductor stack may further include, before the step of forming a quantum well light-receiving layer, a step of coating an inside of a growth chamber used for performing the step of forming a quantum well light-receiving layer. This can suppress the mixing, into the quantum well light-receiving layer, of impurities separated from members for the growth chamber.

The above method for producing a semiconductor stack may further include, before the step of forming a quantum well light-receiving layer, a step of baking an inside of a growth chamber used for performing the step of forming a quantum well light-receiving layer by heating the inside to 600° C. or higher. This can suppress the mixing, into the quantum well light-receiving layer, of impurities separated from members for the growth chamber.

The above method for producing a semiconductor stack may further include, before the step of forming a quantum well light-receiving layer, a step of cleaning a member disposed inside a growth chamber used for performing the step of forming a quantum well light-receiving layer. This can suppress the mixing, into the quantum well light-receiving layer, of impurities separated from the member for the growth chamber.

DETAILS OF EMBODIMENTS OF THE PRESENT INVENTION

First Embodiment

Next, a semiconductor stack according to a first embodiment of the present invention will be described below with reference to the attached drawings. In these drawings, the same or corresponding components are denoted by the same reference numerals and repetitive descriptions thereof are omitted.

Referring to FIG. 1, a semiconductor stack 10 according to this embodiment includes a substrate 20, a buffer layer 30 serving as a first-conductivity-type layer, a quantum well structure 40 serving as a quantum well light-receiving layer, and a contact layer 50 serving as a second-conductivity-type layer.

The substrate 20 is formed of a III-V compound semiconductor. The substrate 20 has a diameter of 50 mm or more such as 3 inches. Examples of the III-V compound semiconductor for the substrate 20 include GaAs, GaP, GaSb, InP, InAs, InSb, AlSb, and AlAs. By employing the substrate 20 formed of such a III-V compound semiconductor, the semiconductor stack 10 suitable for production of infrared light-receiving devices can be obtained. Specifically, for example, InP (n-InP) whose conductivity type is an n-type is employed as a compound semiconductor for the substrate 20. An n-type impurity contained in the substrate 20 may be, for example, S (sulfur). The diameter of the substrate 20 may be 80 mm or more (e.g., 4 inches), 105 mm or more (e.g., 5 inches), or 130 mm or more (e.g., 6 inches) for the purpose of improving the production efficiency and yield of semiconductor devices (light-receiving devices) including the semiconductor stack 10.

The buffer layer 30 is a semiconductor layer disposed so as to be in contact with one main surface 20A of the substrate 20. The buffer layer 30 is formed of a III-V compound semiconductor. Examples of the III-V compound semiconductor for the buffer layer 30 include binary materials such as GaSb, AlSb (aluminum antimonide), and InSb (indium antimonide); and ternary materials such as InGaAs (indium gallium arsenide), InGaSb (indium gallium antimonide), AlInSb (aluminum indium antimonide), and AlGaSb (aluminum gallium antimonide). Specifically, for example, InGaAs (p-InGaAs) whose conductivity type is a p-type is employed as a compound semiconductor for the buffer layer 30. A p-type impurity contained in the buffer layer 30 may be, for example, C (carbon), Be (beryllium), Mg (magnesium), or Zn (zinc).

The quantum well structure 40 is disposed so as to be in contact with a first main surface 30A of the buffer layer 30, the first main surface 30A being on a side of the buffer layer 30 opposite to the other side facing the substrate 20. The quantum well structure 40 has a structure in which two component layers formed of III-V compound semiconductors are alternately stacked. More specifically, the quantum well structure 40 has a structure in which first component layers 41 and second component layers 42 are alternately stacked. The first component layers 41 may be formed of a material such as $In_xGa_{1-x}As$ (x is 0.38 or more and 1 or less). The second component layers 42 may be formed of a material such as $GaAs_{1-y}Sb_y$ (y is 0.36 or more and 1 or less) (gallium arsenide antimonide) containing Sb as a group V element. The materials for the first component layers 41 and the second component layers 42 are not limited to the above materials. For example, the first component layers 41 may be formed of a material such as $Ga_{1-u}In_uN_vAs_{1-b}$ (u is 0.4 or more and 0.8 or less, v is more than 0 and 0.2 or less) (gallium indium nitride arsenide). The second component layers 42 may be formed of a material such as $GaAs_{1-y}Sb_y$ (y is 0.36 or more and 0.62 or less) containing Sb as a group V element.

When a multiple quantum well structure including pairs of $In_xGa_{1-x}As$ (x is 0.38 or more and 1 or less) layers and $GaAs_{1-y}Sb_y$ (y is 0.36 or more and 1 or less) layers or pairs of $Ga_{1-u}In_uN_vAs_{1-v}$ (u is 0.4 or more and 0.8 or less, v is more than 0 and 0.2 or less) layers and $GaAs_{1-y}Sb_y$ (y is 0.36 or more and 0.62 or less) layers is employed as a quantum well light-receiving layer, a semiconductor stack 10 can be produced that can be used for production of light-receiving devices suitable for detection of light in a near-infrared region to a mid-infrared region.

Alternatively, the first component layers 41 may be formed of a material such as InAs and the second component layers 42 may be formed of a material such as GaSb. When a multiple quantum well structure including pairs of InAs layers and GaSb layers is employed as a quantum well light-receiving layer, a semiconductor stack 10 can be produced that can be used for production of light-receiving devices suitable for detection of infrared light having a wavelength of 4 to 12 μm.

To compensate for the strain of the quantum well structure 40, the unit structure of the quantum well structure 40 may include a strain compensation layer in addition to the first component layer 41 and the second component layer 42. In this embodiment, the quantum well structure 40 is a multiple quantum well structure. However, a single quantum well structure may be employed instead of the multiple quantum well structure.

Referring to FIG. 1, the contact layer 50 is disposed so as to be in contact with a main surface 40A of the quantum well structure 40, the main surface 40A being on a side of the quantum well structure 40 opposite to the other side facing the buffer layer 30. The contact layer 50 is formed of a III-V compound semiconductor.

Examples of the III-V compound semiconductor for the contact layer 50 include InP, InAs, GaSb, GaAs, and InGaAs (indium gallium arsenide). Specifically, for example, InP (n-InP) whose conductivity type is an n-type is employed as a compound semiconductor for the contact layer 50. An n-type impurity contained in the contact layer 50 may be, for example, Si, S, Se, Ge, or Te.

The quantum well structure 40 serving as a quantum well light-receiving layer of the semiconductor stack 10 according to this embodiment has a thickness of 0.5 μm (500 nm) or more. Specifically, each of the first component layers 41 and the second component layers 42 may have a thickness of, for example, 3 nm. The quantum well structure 40 may be obtained by stacking, for example, 100 pairs of unit structures each including the first component layer 41 and the second component layer 42. That is, the quantum well structure 40 may have a thickness of, for example, 600 nm. Thus, the quantum well structure 40 may be a type II quantum well having such a structure. The quantum well structure 40 has a carrier concentration of $1\times10^{16}$ cm$^{-3}$ or less. Therefore, when a light-receiving device is produced using the semiconductor stack 10 according to this embodiment, the sensitivity of a light-receiving device including semiconductor layers formed of a III-V compound semiconductor can be improved and the dark current can be reduced.

In the quantum well structure 40 of the semiconductor stack 10 according to this embodiment, the p-type impurity that generates a p-type carrier and the n-type impurity that generates an n-type carrier each have a concentration of $1\times10^{16}$ cm$^{-3}$ or less. Thus, the carrier concentration in the quantum well structure 40 is $1\times10^{16}$ cm$^{-3}$ or less.

In the semiconductor stack 10, the quantum well structure 40 preferably has a thickness of 1.5 μm or more. The quantum well structure 40 preferably has a carrier concentration of $1\times10^{15}$ cm$^{-3}$ or less. This can further improve the sensitivity of a light-receiving device and reduce the dark current.

In the quantum well structure 40, the p-type impurity that generates a p-type carrier and the n-type impurity that generates an n-type carrier each preferably have a concentration of $1\times10^{15}$ cm$^{-3}$ or less. Thus, the carrier concentration in the quantum well structure 40 is easily controlled to $1\times10^{15}$ cm$^{-3}$ or less.

In the semiconductor stack 10, the quantum well structure 40 preferably has a thickness of 2.0 μm or more. The quantum well structure 40 preferably has a carrier concentration of $7\times10^{14}$ cm$^{-3}$ or less. This can further improve the sensitivity of a light-receiving device and reduce the dark current.

In the quantum well structure 40, the p-type impurity that generates a p-type carrier and the n-type impurity that generates an n-type carrier each preferably have a concentration $7\times10^{14}$ cm$^{-3}$ or less. Thus, the carrier concentration in the quantum well structure 40 is easily controlled to $7\times10^{14}$ cm$^{-3}$ or less.

In the semiconductor stack 10, the buffer layer 30, the quantum well structure 40, and the contact layer 50 are preferably stacked on the substrate 20 without forming a regrowth interface. Thus, the dark current can be reduced with more certainty.

In the semiconductor stack 10, the oxygen concentration, the carbon concentration, and the hydrogen concentration at an interface between the buffer layer 30 and the quantum well structure 40 and at an interface between the quantum well structure 40 and the contact layer 50 are each preferably $1\times10^{17}$ cm$^{-3}$ or less. Thus, the dark current can be reduced with more certainty.

In the semiconductor stack 10, the buffer layer 30, the quantum well structure 40, and the contact layer 50 is preferably formed by a metal-organic vapor phase epitaxy method. Thus, a semiconductor stack 10 formed of high-quality crystals is easily produced.

Figure 2:
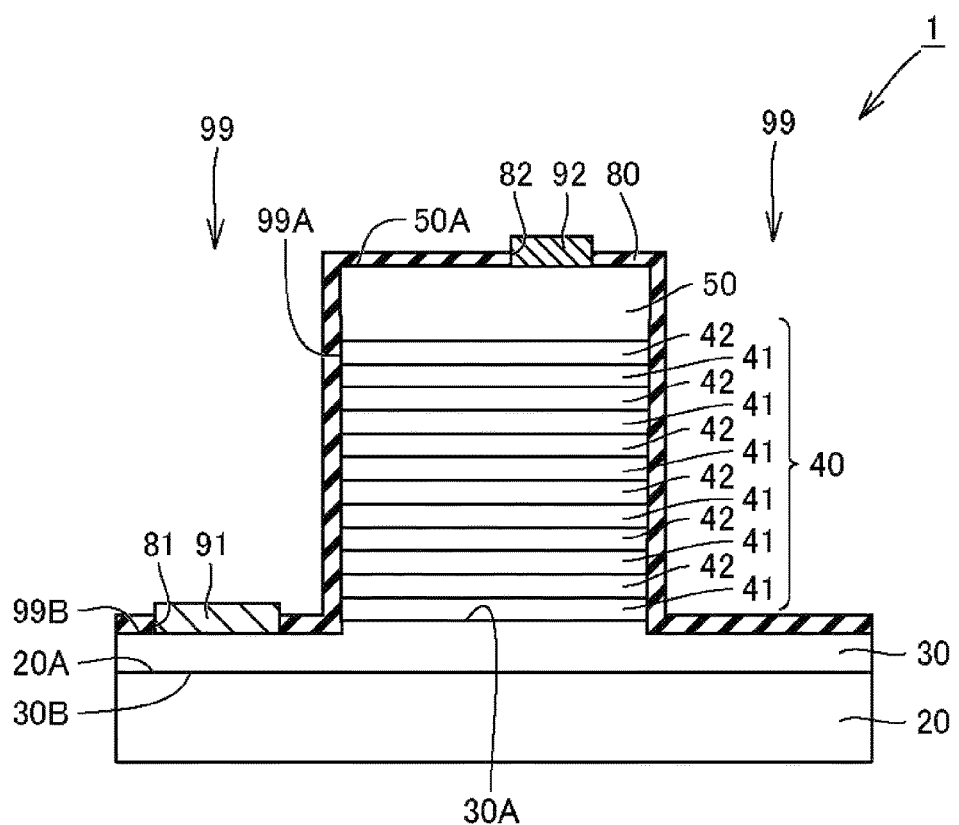
FIG. 2 is a schematic sectional view illustrating a structure of a light-receiving device according to the first embodiment.

Next, an infrared light-receiving device (photodiode) which is an example of a light-receiving device produced using the semiconductor stack 10 will be described. Referring to FIG. 2, an infrared light-receiving device 1 according to this embodiment is produced using the semiconductor stack 10 according to this embodiment and includes a substrate 20, a buffer layer 30, a quantum well structure 40, and a contact layer 50. The buffer layer 30, the quantum well structure 40, and the contact layer 50 are stacked on the substrate 20 in the same manner as in the case of the semiconductor stack 10. The infrared light-receiving device 1 includes trenches 99 formed so as to extend through the contact layer 50 and the quantum well structure 40 and reach the buffer layer 30. That is, the contact layer 50 and the quantum well structure 40 are exposed at side walls 99A of the trenches 99. Bottom walls 99B of the trenches 99 are located in the buffer layer 30. That is, the buffer layer 30 is exposed at the bottom walls 99B of the trenches 99.

The infrared light-receiving device 1 further includes a passivation layer 80, a p-electrode 91, and an n-electrode 92. The passivation layer 80 is disposed so as to cover the bottom walls 99B of the trenches 99, the side walls 99A of the trenches 99, and a main surface 50A of the contact layer 50, the main surface 50A being on a side of the contact layer 50 opposite to the other side facing the quantum well structure 40. The passivation layer 80 is formed of an insulator such as silicon nitride or silicon oxide.

An opening 81 is formed in the passivation layer 80 that covers the bottom wall 99B of the trench 99 so as to extend through the passivation layer 80 in the thickness direction. The p-electrode 91 is disposed such that the opening 81 is filled with the p-electrode 91. The p-electrode 91 is disposed so as to be in contact with the buffer layer 30 exposed through the opening 81. The p-electrode 91 is formed of an electric conductor such as a metal. More specifically, the p-electrode 91 may be formed of, for example, Ti (titanium)/Pt (platinum)/Au (gold). The p-electrode 91 forms an ohmic contact with the buffer layer 30.

An opening 82 is formed in the passivation layer 80 that covers the main surface 50A of the contact layer 50 so as to extend through the passivation layer 80 in the thickness direction. The n-electrode 92 is disposed such that the opening 82 is filled with the n-electrode 92. The n-electrode 92 is disposed so as to be in contact with the contact layer 50 exposed through the opening 82. The n-electrode 92 is formed of an electric conductor such as a metal. More specifically, the n-electrode 92 may be formed of, for example, Ti/Pt/Au. The n-electrode 92 forms an ohmic contact with the contact layer 50.

When infrared light enters the infrared light-receiving device 1, the infrared light is absorbed between quantum levels within the quantum well structure 40, resulting in generation of electron-hole pairs. The generated electrons and holes are output as photocurrent signals from the infrared light-receiving device 1. Thus, the infrared light is detected.

The n-electrode 92 is a pixel electrode. The infrared light-receiving device 1 may include only one n-electrode 92 that is a pixel electrode as illustrated in FIG. 2 or may include a plurality of pixel electrodes (n-electrodes 92). Specifically, the infrared light-receiving device 1 may have a structure in which a plurality of unit structures each illustrated in FIG. 2 are arranged in a direction in which one main surface 20A of the substrate 20 extends in FIG. 2. In this case, the infrared light-receiving device 1 includes a plurality of n-electrodes 92 corresponding to the pixels while including only one p-electrode 91. This structure will be described in Fourth Embodiment later.

The infrared light-receiving device 1 according to this embodiment includes the semiconductor stack 10 according to this embodiment. Therefore, the infrared light-receiving device 1 is a light-receiving device in which the sensitivity is improved and the dark current is reduced.

Next, a method for producing the semiconductor stack 10 and the infrared light-receiving device 1 according to this embodiment will be outlined with reference to FIG. 3 to FIG. 11.

Figure 3:
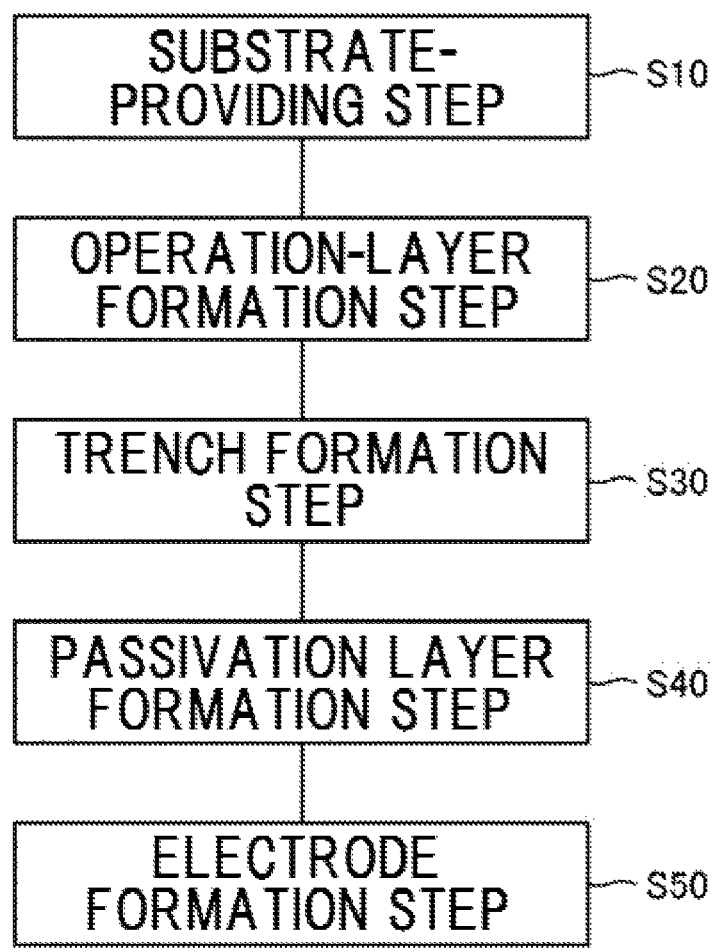
FIG. 3 is a flowchart schematically illustrating a method for producing the semiconductor stack and the light-receiving device according to the first embodiment.

Referring to FIG. 3, in the method for producing the semiconductor stack 10 and the infrared light-receiving device 1 according to this embodiment, a substrate-providing step is first performed as Step (S10). In Step (S10), referring to FIG. 8, for example, a substrate 20 having a diameter of 2 inches (50.8 mm) and formed of InP is provided. More specifically, the substrate 20 formed of InP is provided by slicing an ingot formed of InP. A surface of the substrate 20 is polished and then subjected to processes such as washing. Thus, the substrate 20 whose main surface 20A has sufficient flatness and cleanliness is provided.

Figure 4:
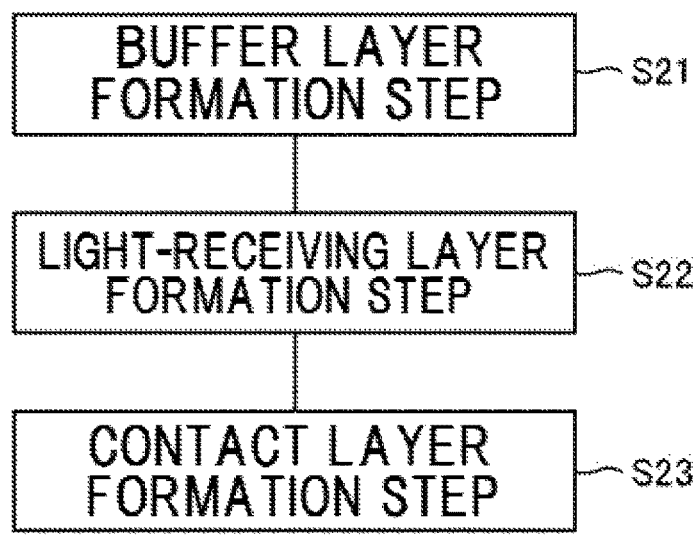
FIG. 4 is a flowchart schematically illustrating the procedure of an operation-layer formation step.

Subsequently, an operation-layer formation step is performed as Step (S20). In Step (S20), a buffer layer 30, a quantum well structure 40, and a contact layer 50 are formed as operation layers on the main surface 20A of the substrate 20 provided in Step (S10). The operation layers can be formed by, for example, metal-organic vapor phase epitaxy. The formation of the operation layers by metal-organic vapor phase epitaxy can be performed by, for example, placing the substrate 20 on a rotation table equipped with a heater for heating a substrate and supplying source gases onto the substrate while the substrate 20 is heated with the heater. Referring to FIG. 4, Step (S20) includes a buffer layer formation step (S21), a quantum well light-receiving layer formation step (S22), and a contact layer formation step (S23).

In Step (S20), Step (S21) is first performed. Specifically, referring to FIG. 8, for example, a buffer layer 30 formed of p-InGaAs, which is a III-V compound semiconductor, is formed on and in contact with the main surface 20A of the substrate 20 by metal-organic vapor phase epitaxy. In the formation of the buffer layer 30 formed of p-InGaAs, examples of the In source include TMIn (trimethylindium) and TEIn (triethylindium). Examples of the Ga source include TEGa (triethylgallium) and TMGa (trimethylgallium). Examples of the As source include TBAs (tertiary-butylarsine) and TMAs (trimethylarsenic). When C is added as a p-type impurity, for example, $CBr_4$ (carbon tetrabromide) or $CCl_4$ (carbon tetrachloride) may be added to the source gas. When Zn is added as a p-type impurity, for example, DMZn (dimethylzinc) or DEZn (diethylzinc) may be added to the source gas.

Subsequently, Step (S22) is performed. Specifically, referring to FIG. 8 and FIG. 9, for example, first component layers 41 formed of $In_xGa_{1-x}As$ (x is 0.38 or more and 1 or less), which is a III-V compound semiconductor, and second component layers 42 formed of $GaAs_{1-y}Sb_y$ (y is 0.36 or more and 1 or less), which is a III-V compound semiconductor, are alternately stacked on and in contact with a first main surface 30A of the buffer layer 30, the first main surface 30A being on a side of the buffer layer 30 opposite to the other side facing the substrate 20. Thus, a quantum well structure 40 is formed. The formation of the quantum well structure 40 can be performed by metal-organic vapor phase epitaxy after the formation of the buffer layer 30. In other words, the formation of the quantum well structure 40 can be performed by changing the source gas while the substrate 20 is placed in the apparatus used in the formation of the buffer layer 30. The quantum well structure 40 is formed so as to have a thickness of 0.5 μm or more and a carrier concentration of $1 \times 10^{16}$ $cm^{-3}$ or less.

In the formation of the first component layers 41 formed of $In_xGa_{1-x}As$ (x is 0.38 or more and 1 or less), examples of the In source include TMIn and TEIn. Examples of the Ga source include TEGa and TMGa. Examples of the As source include TBAs and TMAs. In the formation of the second component layers 42 formed of $GaAs_{1-y}Sb_y$ (y is 0.36 or more and 1 or less), examples of the Ga source include TEGa and TMGa. Examples of the As source include TBAs and TMAs. Examples of the Sb source include TMSb (trimethylantimony), TESb (triethylantimony), TIPSb (triisopropylantimony), TDMASb (trisdimethylaminoantimony), and TTBSb (tritertiarybutylantimony). The first component layers 41 and the second component layers 42 can be formed so as to each have a thickness of, for example, 3 nm and so that, for example, 100 pairs of unit structures each including the first component layer 41 and the second component layer 42 are stacked. Thus, a quantum well structure 40 serving as a type II quantum well can be formed.

Subsequently, Step (S23) is performed. Specifically, referring to FIG. 9 and FIG. 1, for example, a contact layer 50 formed of n-InP, which is a III-V compound semiconductor, is formed on and in contact with a main surface 40A of the quantum well structure 40, the main surface 40A being on a side of the quantum well structure 40 opposite to the other side facing the buffer layer 30. The formation of the contact layer 50 can be performed by metal-organic vapor phase epitaxy after the formation of the quantum well structure 40. In other words, the formation of the contact layer 50 can be performed by changing the source gas while the substrate 20 is placed in the apparatus used in the formation of the quantum well structure 40. When Si is added as an n-type impurity, for example, TeESi (tetraethylsilane) may be added to the source gas.

Through the above procedure, the semiconductor stack 10 according to this embodiment is completed. By performing Step (S20) by metal-organic vapor phase epitaxy as described above, the production efficiency of the semiconductor stack 10 can be improved. Herein, the metal-organic vapor phase epitaxy in Step (S20) is not limited to a metal-organic vapor phase epitaxy method using only metal organic sources, but may be a metal-organic vapor phase epitaxy method using hydrides such as $AsH_3$ (arsine) as an As source and $SiH_4$ (silane) as a Si source. However, by employing a metal-organic vapor phase epitaxy method using only metal organic sources, a semiconductor stack 10 formed of high-quality crystals can be obtained. Alternatively, Step (S20) may be performed by a method other than the metal-organic vapor phase epitaxy, such as a MBE (molecular beam epitaxy) method.

Steps (S21) to (S23) are preferably performed in a continuous manner by changing the source gas while the substrate 20 is placed in the apparatus as described above. That is, Steps (S21) to (S23) are preferably performed so that the buffer layer 30, the quantum well structure 40, and the contact layer 50 are stacked without forming a regrowth interface. Thus, the dark current can be reduced with more certainty.

From the viewpoint of easily controlling each of the p-type impurity concentration and the n-type impurity concentration in the quantum well structure 40 in Step (S20) to $1\times10^{16}$ cm$^{-3}$ or less, Step (S20) may be performed in accordance with Modifications below.

<Modification 1>

Figure 5:
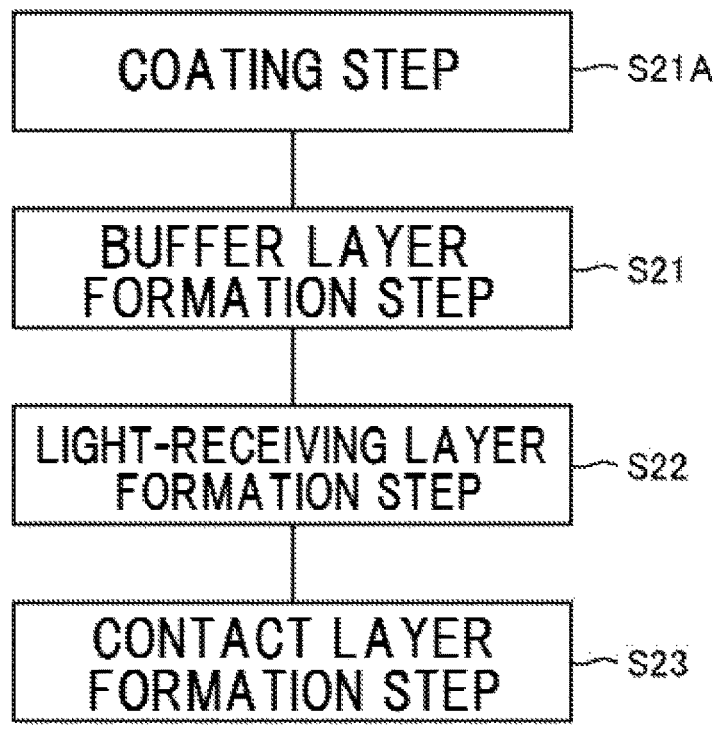
FIG. 5 is a flowchart illustrating the procedure of an operation-layer formation step according to Modification 1.

Referring to FIG. 5, in Modification 1, a coating step is first performed as Step (S21A). In Step (S21A), the inside of a growth chamber where Steps (S21) to (S23) are performed is subjected to coating. Specifically, before Steps (S21) to (S23), for example, a GaAs source gas is caused to flow through the growth chamber to coat the inside of the growth chamber with GaAs. Then, Steps (S21) to (S23) are performed as described above. This suppresses mixing, into the quantum well structure 40, of impurities such as C, Si, and O derived from C, SiO$_2$ (silicon dioxide), and Al$_2$O$_3$ (aluminum oxide) that are materials for members disposed inside the growth chamber and inner walls of the growth chamber. As a result, each of the p-type impurity concentration and the n-type impurity concentration in the quantum well structure 40 is easily controlled to $1\times10^{16}$ cm$^{-3}$ or less. When the p-type impurity concentration and the n-type impurity concentration are decreased, the carrier concentration in the quantum well structure 40 can be easily controlled to $1\times10^{16}$ cm$^{-3}$ or less. The coating material is not limited to GaAs, and may be, for example, InP, InGaAs, AlGaAs, InAs, GaP, or GaSb.

<Modification 2>

Figure 6:
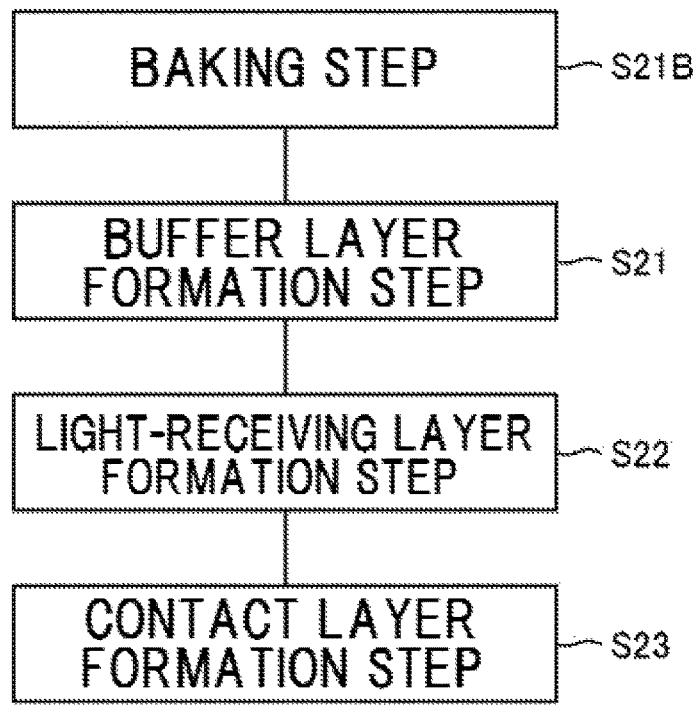
FIG. 6 is a flowchart illustrating the procedure of an operation-layer formation step according to Modification 2.

Referring to FIG. 6, in Modification 2, a baking step is first performed as Step (S21B). In Step (S21B), the inside of the growth chamber where Steps (S21) to (S23) are performed is baked by being heated to 600° C. or higher. Specifically, before Steps (S21) to (S23), the inside of the growth chamber is heated to a temperature, such as 650° C., that is higher than the temperature at which Steps (S21) to (S23) are performed. Herein, an inert gas such as Ar is introduced into the growth chamber. Then, Steps (S21) to (S23) are performed as described above. This suppresses mixing of impurities adhering to the members disposed inside the growth chamber and the inner walls of the growth chamber into the quantum well structure 40 through separation of the impurities in Steps (S21) to (S23). As a result, each of the p-type impurity concentration and the n-type impurity concentration in the quantum well structure 40 is easily controlled to $1\times10^{16}$ cm$^{-3}$ or less. When the p-type impurity concentration and the n-type impurity concentration are decreased, the carrier concentration in the quantum well structure 40 can be easily controlled to $1\times10^{16}$ cm$^{-3}$ or less.

<Modification 3>

Figure 7:
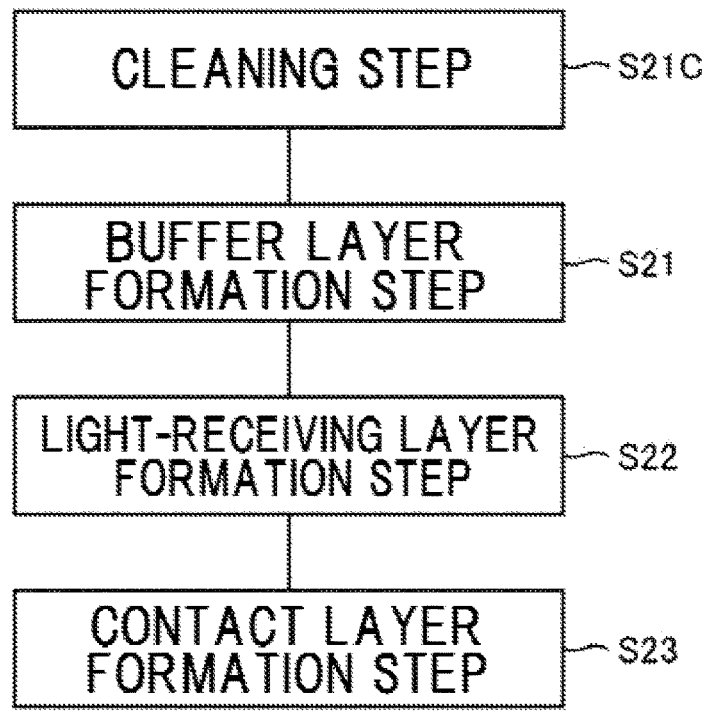
FIG. 7 is a flowchart illustrating the procedure of an operation-layer formation step according to Modification 3.
Figure 8:
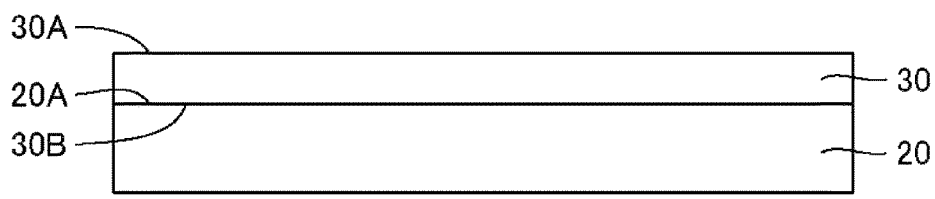
FIG. 8 is a schematic sectional view for describing a method for producing the semiconductor stack and the light-receiving device according to the first embodiment.
Figure 9:
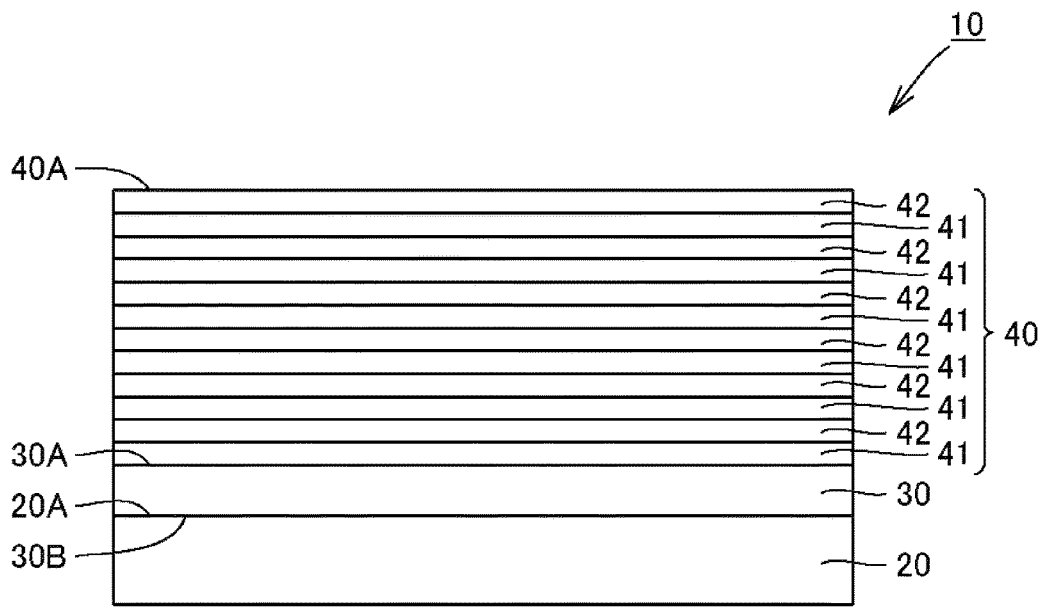
FIG. 9 is a schematic sectional view for describing a method for producing the semiconductor stack and the light-receiving device according to the first embodiment.
Figure 10:
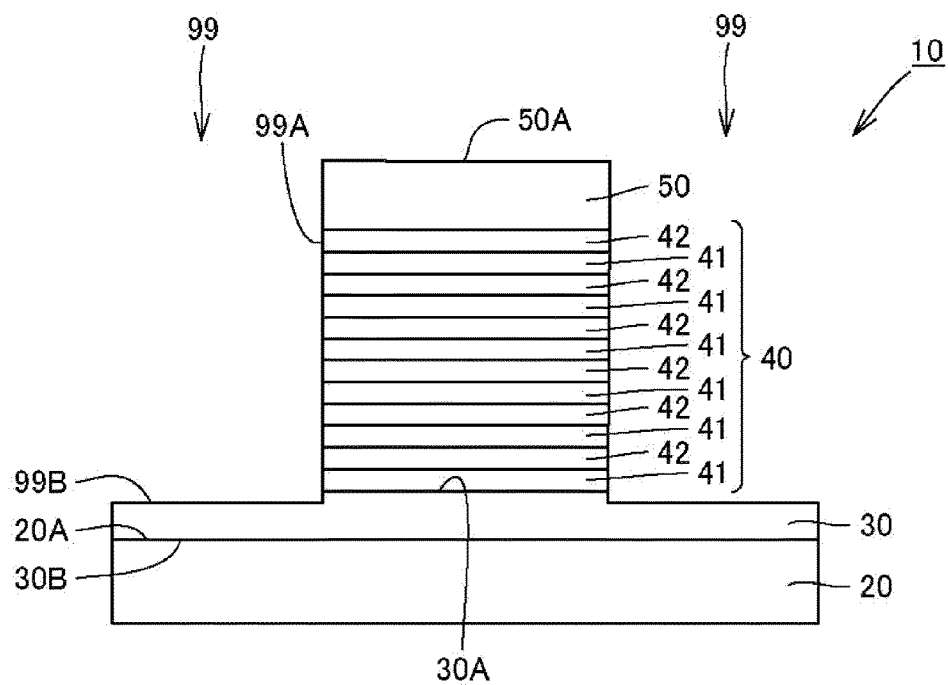
FIG. 10 is a schematic sectional view for describing a method for producing the semiconductor stack and the light-receiving device according to the first embodiment.
Figure 11:
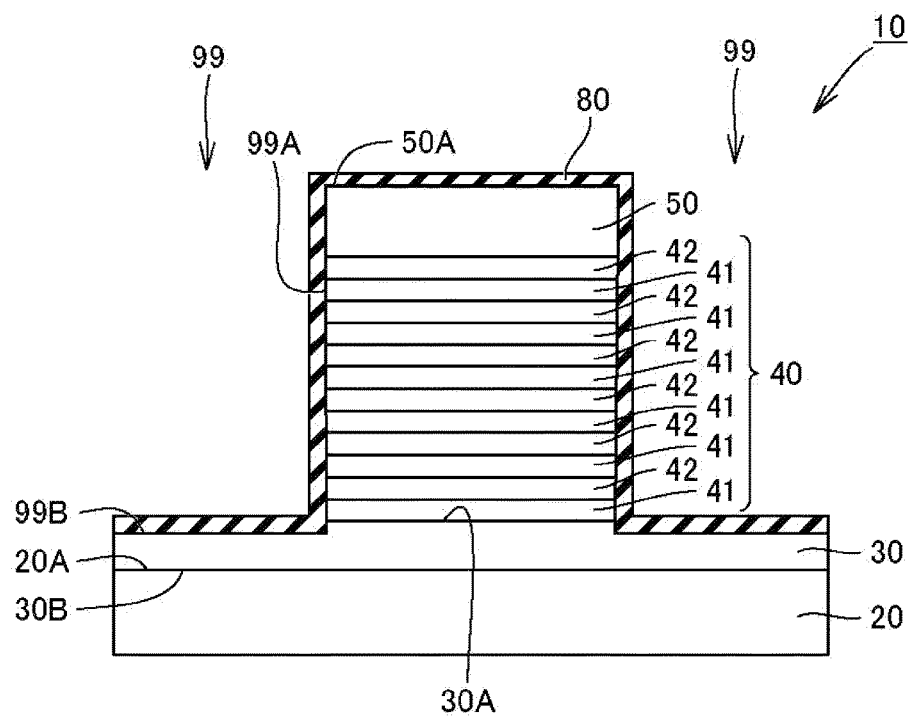
FIG. 11 is a schematic sectional view for describing a method for producing the semiconductor stack and the light-receiving device according to the first embodiment.

Referring to FIG. 7, in Modification 3, a cleaning step is first performed as Step (S21C). In Step (S21C), members disposed inside the growth chamber where Steps (S21) to (S23) are performed are cleaned. Specifically, before Steps (S21) to (S23), members (e.g., susceptor) that contact the source gases in the growth chamber are cleaned using, for example, aqua regia, hydrochloric acid, and phosphoric acid. Then, Steps (S21) to (S23) are performed as described above. This suppresses mixing of impurities adhering to the members disposed inside the growth chamber into the quantum well structure 40 through separation of the impurities in Steps (S21) to (S23). As a result, each of the p-type impurity concentration and the n-type impurity concentration in the quantum well structure 40 is easily controlled to $1\times10^{16}$ cm$^{-3}$ or less. When the p-type impurity concentration and the n-type impurity concentration are decreased, the carrier concentration in the quantum well structure 40 can be easily controlled to $1\times10^{16}$ cm$^{-3}$ or less.

Subsequently, referring to FIG. 3, a trench formation step is performed as Step (S30). In Step (S30), referring to FIG. 1 and FIG. 10, trenches 99 are formed in the semiconductor stack 10 produced through Steps (S10) to (S20) so as to extend through the contact layer 50 and the quantum well structure 40 and reach the buffer layer 30. The trenches 99 can be formed by, for example, forming a mask layer having openings corresponding to the trenches 99 on the main surface 50A of the contact layer 50 and performing etching.

Subsequently, a passivation layer formation step is performed as Step (S40). In Step (S40), referring to FIG. 10 and FIG. 11, a passivation layer 80 is formed on the semiconductor stack 10 in which the trenches 99 have been formed in Step (S30). Specifically, a passivation layer 80 formed of an insulator such as silicon oxide or silicon nitride is formed by, for example, CVD (chemical vapor deposition). The passivation layer 80 is formed so as to cover the bottom walls 99B of the trenches 99, the side walls 99A of the trenches 99, and a main surface 50A of the contact layer 50, the main surface 50A being on a side of the contact layer 50 opposite to the other side facing the quantum well structure 40.

Subsequently, an electrode formation step is performed as Step (S50). In Step (S50), referring to FIG. 11 and FIG. 2, a p-electrode 91 and an n-electrode 92 are formed on the semiconductor stack 10 in which the passivation layer 80 has been formed in Step (S40). Specifically, for example, a mask having openings at positions corresponding to regions in which the p-electrode 91 and the n-electrode 92 are to be formed is formed on the passivation layer 80, and openings 81 and 82 are formed in the passivation layer 80 using the mask. Then, the p-electrode 91 and the n-electrode 92 formed of an appropriate electric conductor are formed by, for example, a vapor deposition method. Through the above steps, the infrared light-receiving device 1 according to this embodiment is completed. Subsequently, the infrared light-receiving device 1 is separated into individual devices by dicing or the like.

Second Embodiment

Figure 12:
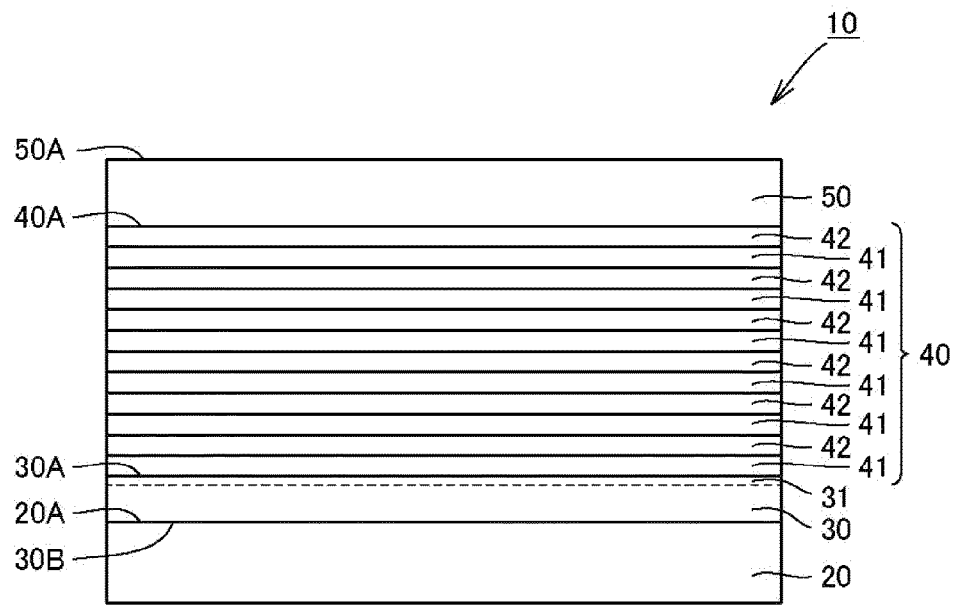
FIG. 12 is a schematic sectional view illustrating a structure of a semiconductor stack according to a second embodiment.
Figure 13:
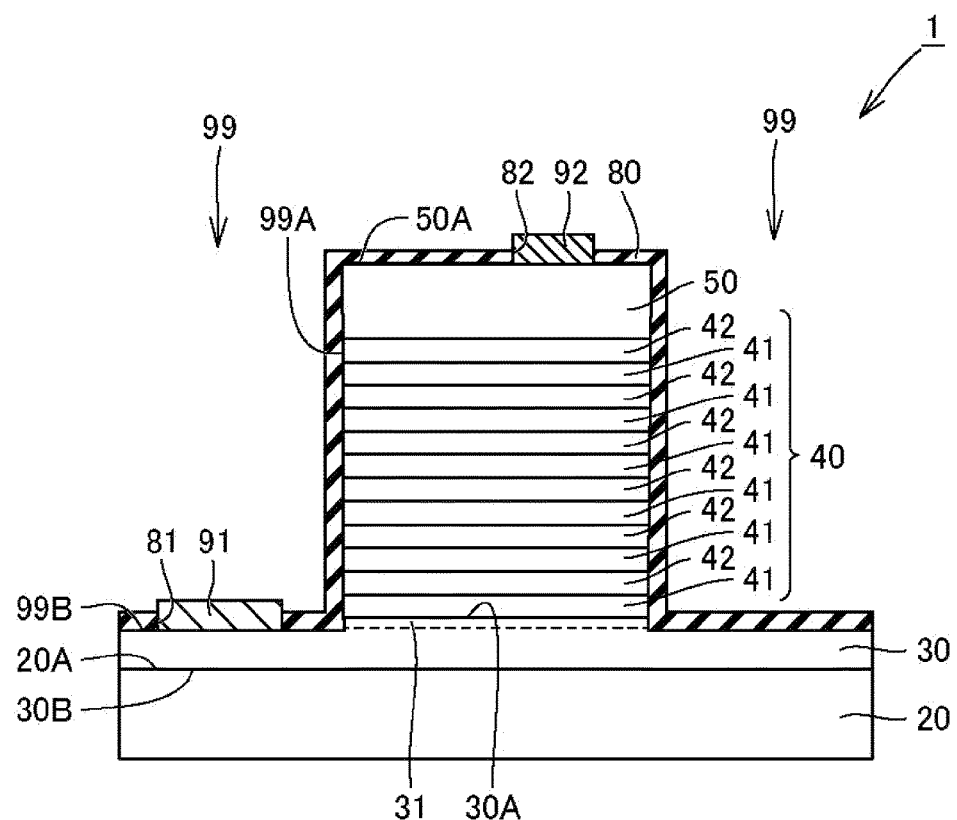
FIG. 13 is a schematic sectional view illustrating a structure of a light-receiving device according to the second embodiment.

Next, a semiconductor stack and a light-receiving device according to a second embodiment of the present invention will be described. FIG. 12 is a schematic sectional view illustrating a structure of a semiconductor stack 10 according to the second embodiment. FIG. 13 is a schematic sectional view illustrating a structure of an infrared light-receiving device 1 according to the second embodiment. Referring to FIGS. 12 and 13 and FIGS. 1 and 2, the semiconductor stack 10 and the infrared light-receiving device 1 according to this embodiment basically have the same structures as those in the first embodiment and produce the same effects as those in the first embodiment. However, the semiconductor stack 10 and the infrared light-receiving device 1 according to this embodiment are different from those in the first embodiment in terms of the structure of the buffer layer 30.

Referring to FIG. 12 and FIG. 13, the semiconductor stack 10 according to the second embodiment includes a substrate 20, a p-type buffer layer 30 serving as a first-conductivity-type layer, a quantum well structure 40 serving as a quantum well light-receiving layer, and an n-type contact layer 50 serving as a second-conductivity-type layer. The semiconductor stack 10 further includes a low p-type impurity concentration region 31 in a region including the first main surface 30A that is a main surface of the p-type buffer layer 30 near the quantum well structure 40. The low p-type impurity concentration region 31 has a p-type impurity concentration of $5 \times 10^{17}$ cm$^{-3}$ or less and a thickness of 50 nm or more. As a result of the formation of the low p-type impurity concentration region 31, the mixing and diffusion of p-type impurities into the quantum well structure 40 can be easily suppressed. For example, the p-type impurity concentration in the quantum well structure 40 is easily controlled to $5 \times 10^{15}$ cm$^{-3}$ or less. This can further improve the sensitivity of a light-receiving device and reduce the dark current. Referring to FIG. 13, the trenches 99 extend through the low p-type impurity concentration region 31. From another viewpoint, the low p-type impurity concentration region 31 is located in a region sandwiched between trenches 99 adjacent to each other. That is, the low p-type impurity concentration region 31 is not exposed at the bottom walls 99B of the trenches 99. Consequently, the p-electrode 91 easily forms an ohmic contact with the buffer layer 30. The low p-type impurity concentration region 31 can be formed by decreasing the flow rate of a source gas for introducing a p-type impurity at the late stage of the formation of the buffer layer 30.

Third Embodiment

Next, a semiconductor stack and a light-receiving device according to a third embodiment of the present invention will be described. The semiconductor stack and the light-receiving device according to the third embodiment basically have the same structures as those in the first embodiment and produce the same effects as those in the first embodiment. However, the semiconductor stack and the light-receiving device according to the third embodiment are different from those in the first embodiment in terms of the following structure.

Referring to FIG. 1 and FIG. 2, in the quantum well structure 40 of the semiconductor stack 10 and the infrared light-receiving device 1 according to the third embodiment, one of the p-type impurity and the n-type impurity is contained in a concentration of more than $1 \times 10^{16}$ cm$^{-3}$, and the other of the p-type impurity and the n-type impurity is contained in such a concentration that the difference in concentration between the one and the other is $1 \times 10^{16}$ cm$^{-3}$ or less. Thus, the carrier concentration in the quantum well structure 40 is controlled to $1 \times 10^{16}$ cm$^{-3}$ or less.

Even in the case where one of the p-type impurity and the n-type impurity is contained in the quantum well structure 40 in a concentration of more than $1 \times 10^{16}$ cm$^{-3}$, if the carrier concentration is $1 \times 10^{16}$ cm$^{-3}$ or less because of the presence of the other of the p-type impurity and the n-type impurity in the quantum well structure 40, the dark current can be reduced to its permissible range. When the carrier concentration is within the above range, a sufficient depletion layer width is achieved at a typical operating voltage. By setting the thickness of the quantum well structure 40 to 0.5 μm or more under the conditions in which a sufficient depletion layer width is achieved, the sensitivity can be controlled to its permissible range.

In the semiconductor stack 10 and the infrared light-receiving device 1 according to this embodiment, the quantum well structure 40 has a carrier concentration of $1 \times 10^{16}$ cm$^{-3}$ or less and a thickness of 0.5 μm or more. Therefore, in the semiconductor stack 10 and the infrared light-receiving device 1 according to this embodiment, the sensitivity can be improved and the dark current can be reduced.

In the semiconductor stack 10 and the infrared light-receiving device 1 according to this embodiment, the quantum well structure 40 preferably has a thickness of 1.5 μm or more. The quantum well structure 40 preferably has a carrier concentration of $1 \times 10^{15}$ cm$^{-3}$ or less. This can further improve the sensitivity of the infrared light-receiving device 1 and reduce the dark current.

In the semiconductor stack 10 and the infrared light-receiving device 1 according to this embodiment, the quantum well structure 40 preferably has a thickness of 2.0 μm or more. The quantum well structure 40 preferably has a carrier concentration of $7 \times 10^{14}$ cm$^{-3}$ or less. This can further improve the sensitivity of the infrared light-receiving device 1 and reduce the dark current.

Herein, if the mixing of the p-type impurity into the quantum well structure 40 is inevitable under the constraints of production conditions or the like, the quantum well structure 40 according to this embodiment can be formed by intentionally introducing an n-type impurity during the formation of the quantum well structure 40.

Fourth Embodiment

Figure 14:
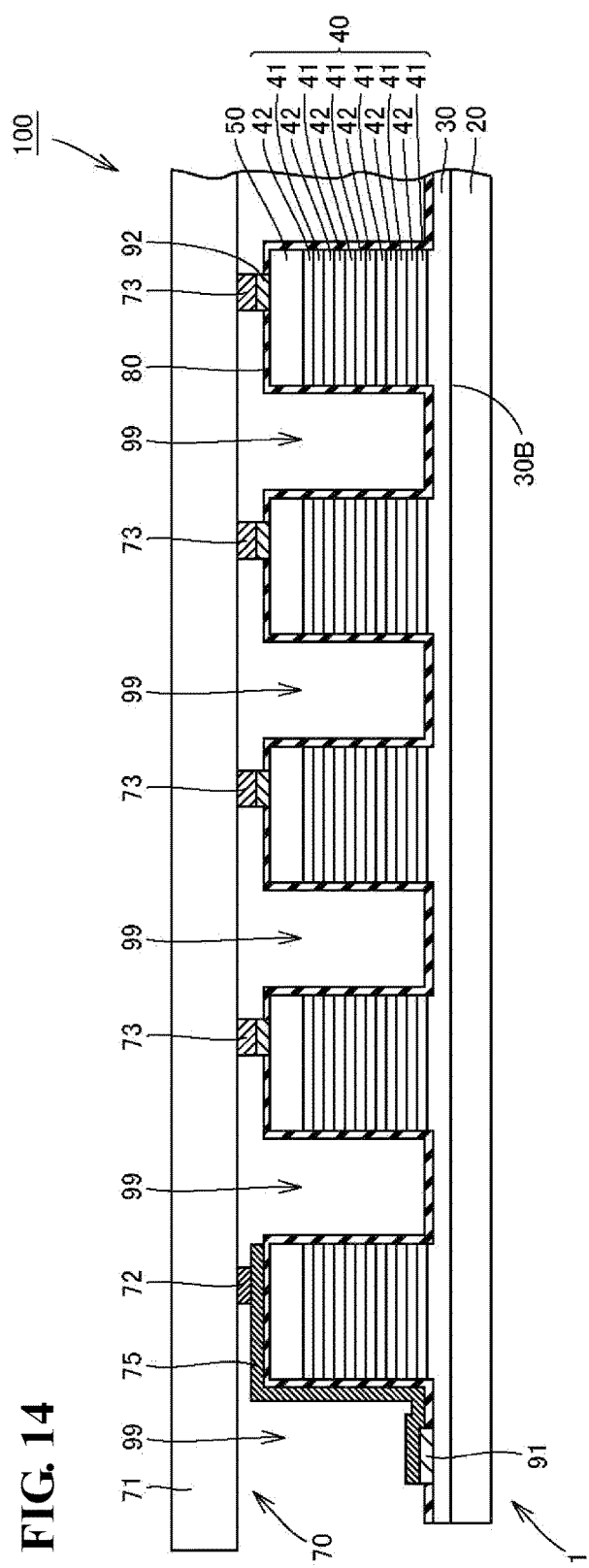
FIG. 14 is a schematic sectional view illustrating structures of a light-receiving device and a sensor according to a fourth embodiment.

Next, a light-receiving device and a sensor according to a fourth embodiment of the present invention will be described. Referring to FIG. 14 and FIG. 2, an infrared light-receiving device 1 according to the fourth embodiment has a structure in which a plurality of unit structures each illustrated in FIG. 2 are arranged in a direction in which one main surface 20A of the substrate 20 extends. The infrared light-receiving device 1 includes a plurality of n-electrodes 92 corresponding to the pixels while including only one p-electrode 91.

More specifically, referring to FIG. 14, the p-electrode 91 of the infrared light-receiving device 1 according to the fourth embodiment is formed on the bottom wall of a trench 99 located at the end in a direction in which the substrate 20 extends. The n-electrode 92 on a contact layer 50 adjacent to the trench 99 located at the end is omitted. An infrared sensor 100 according to this embodiment includes the infrared light-receiving device 1 having such a structure and a read-out integrated circuit (ROIC) 70 electrically connected to the infrared light-receiving device 1. The read-out integrated circuit 70 is, for example, a CMOS (complementary metal oxide semiconductor) circuit.

A plurality of read-out electrodes (not illustrated) disposed on a main body 71 of the read-out integrated circuit 70 and the plurality of n-electrodes 92 functioning as pixel electrodes in the infrared light-receiving device 1 are electrically connected to each other in a one-to-one relationship with bumps 73 disposed therebetween. In the infrared light-receiving device 1, a wiring line 75 is formed so as to be in contact with the p-electrode 91, extend along the bottom wall and side wall of the trench 99 at which the p-electrode 91 is located, and reach a region above the contact layer 50. The wiring line 75 and a ground electrode (not illustrated) disposed on the main body 71 of the read-out integrated circuit 70 are electrically connected to each other with a bump 72 disposed therebetween. With such a structure, light-receiving information from individual pixels of the infrared light-receiving device 1 is output from the n-electrodes 92 (pixel electrodes) to the corresponding read-out electrodes of the read-out integrated circuit 70. The light-receiving information is integrated in the read-out integrated circuit 70 to provide, for example, a two-dimensional image.

Example 1

An experiment was conducted to investigate the relationship between the impurity concentration (carrier concentration) and thickness of a quantum well light-receiving layer and the dark current and sensitivity. The procedure of the experiment is as follows.

An infrared light-receiving device 1 having the same structure as that in the first embodiment was produced. The compound semiconductor for the substrate 20 was n-InP (impurity S). The compound semiconductor for the buffer layer 30 was p-InGaAs (impurity Zn). The compound semiconductor for the first component layer 41 of the quantum well structure 40 was InGaAs. The compound semiconductor for the second component layer 42 was GaAsSb. The compound semiconductor for the contact layer 50 was n-InGaAs (impurity Si). In the infrared light-receiving device 1, the thickness of the quantum well structure 40 serving as a quantum well light-receiving layer was changed, and also the concentration of an impurity contained in the quantum well structure 40 was changed. Si was employed as the impurity. The relationship between the voltage and the depletion layer width obtained when the Si concentration was changed was investigated. Furthermore, the dark current and sensitivity obtained when the Si concentration and the thickness of the quantum well structure 40 were changed were measured. The impurity concentration was measured with a SIMS (secondary ion mass spectrometer). The depletion layer width and the carrier concentration were derived from capacitance-voltage measurement. The dark current was measured at a measurement voltage of 1.0 V at a measurement temperature of −50° C. using a circular device (a cross section perpendicular to a direction in which electric current flows through a current path) having a diameter of 20 µm. Light having a wavelength of 2.2 µm was caused to enter the substrate 20 under the conditions of measurement voltage: 1.0 V and measurement temperature: −50° C., and the sensitivity was measured. Herein, the concentrations of S, Se, Ge, and Te (n-type impurities) and Zn, Be, Mg, and C (p-type impurities), which were impurities other than Si, in the quantum well structure 40 were measured. Consequently, all the concentrations were lower than or equal to the measurement limit. In other words, in this experiment, the impurity concentration and the carrier concentration can be considered equal.

Figure 15:
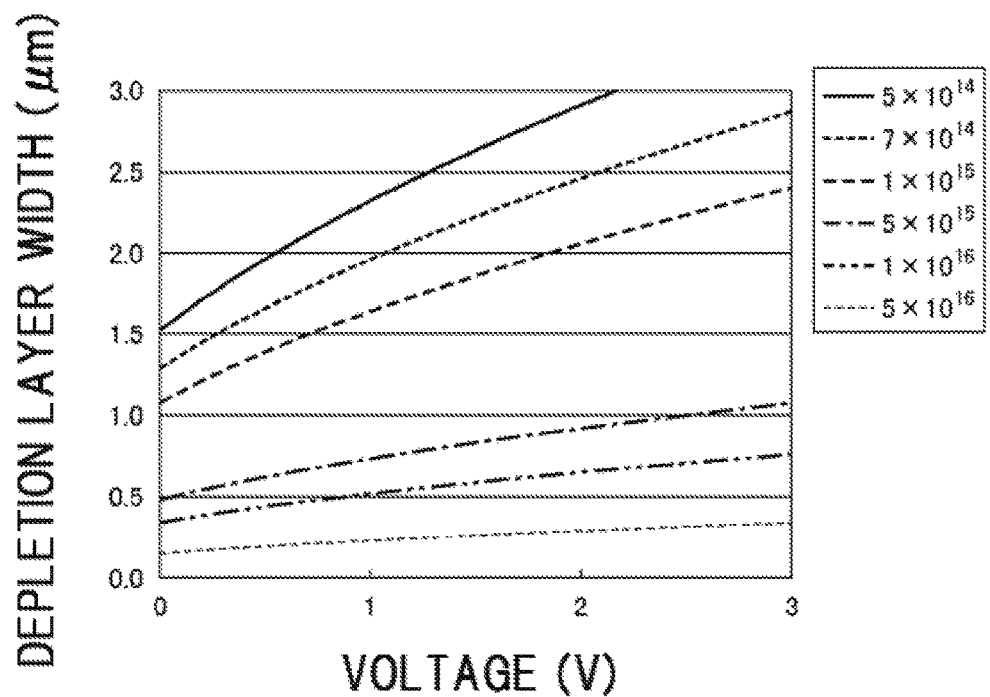
FIG. 15 illustrates the relationship between voltage and depletion layer width obtained when the carrier concentration in a quantum well light-receiving layer is changed.

FIG. 15 illustrates the relationship between the voltage and the depletion layer width obtained when the impurity concentration (carrier concentration) in the quantum well light-receiving layer (quantum well structure 40) was changed. The impurity concentration (carrier concentration) was changed from $5\times10^{14}$ cm$^{-3}$ (a solid line in FIG. 15) to $5\times10^{16}$ cm$^{-3}$ (a narrow broken line in FIG. 15). Referring to FIG. 15, as the impurity (Si) concentration decreases, the depletion layer width increases. As a result, the sensitivity is expected to increase. Furthermore, by controlling the impurity concentration to $1\times10^{16}$ cm$^{-3}$ or less, a depletion layer width of 0.5 µm or more can be achieved at a voltage of 1.0 V.

Table 1 shows the relationship between the impurity concentration (carrier concentration) and thickness of the quantum well light-receiving layer (quantum well structure 40) and the dark current and sensitivity.

TABLE 1

| Impurity concentration (cm$^{-3}$) | Thickness (µm) | | | | | | | | | | | |
|---|---|---|---|---|---|---|---|---|---|---|---|---|
| | 0.3 | | 0.5 | | 1.0 | | 1.5 | | 2.0 | | 2.5 | |
| | Dark current (pA) | Sensitivity (A/W) | Dark current (pA) | Sensitivity (A/W) | Dark current (pA) | Sensitivity (A/W) | Dark current (pA) | Sensitivity (A/W) | Dark current (pA) | Sensitivity (A/W) | Dark current (pA) | Sensitivity (A/W) |
| $5 \times 10^{16}$ | 600 D | 0.1 D | | | | | 600 D | 0.1 D | | | 600 D | 0.1 D |
| $1 \times 10^{16}$ | 140 C | 0.1 D | 140 C | 0.5 C | | | | | | | | |
| $5 \times 10^{15}$ | | | | | | | 60 C | 0.7 C | | | | |
| $1 \times 10^{15}$ | 12 B | | | | 12 B | 0.7 C | 12 B | 1.0 B | | | | |
| $7 \times 10^{14}$ | 5 A | 0.1 D | 5 A | 0.5 C | | | | | 5 A | 1.3 A | | |
| $5 \times 10^{14}$ | | | | | | | | | | | 3 A | 1.6 A |

In Table 1, A, B, C, and D indicate the evaluation outcomes of dark current and sensitivity. "A" was given when a particularly desired outcome was obtained. "B" was given when a desired outcome was obtained. "C" was given when an acceptable outcome was obtained. "D" was given when an unacceptable outcome was obtained. Specifically, regarding the dark current, "A" was given at 5 pA or less, "B" was given at 50 pA or less, "C" was given at 150 pA or less, and "D" was given at more than 150 pA. Regarding the sensitivity, "A" was given at 1.2 A/W or more, "B" was given at 0.8 A/W or more, "C" was given at 0.5 A/W or more, and "D" was given at less than 0.5 A/W. The blank indicates that an experiment corresponding to the conditions was not conducted.

Referring to Table 1, the dark current reduces as the impurity concentration in the quantum well structure 40 decreases regardless of the thickness of the quantum well structure 40. On the other hand, the sensitivity increases when the impurity concentration in the quantum well structure 40 decreases and the thickness of the quantum well structure 40 increases. More specifically, the sensitivity is increased by decreasing the impurity concentration in the quantum well structure 40 to increase the depletion layer width and by adjusting the thickness of the quantum well structure to a thickness larger than or equal to the depletion layer width.

When the quantum well light-receiving layer (quantum well structure 40) has a thickness of 0.5 μm or more and an impurity concentration (carrier concentration) of $1\times10^{16}$ cm$^{-3}$ or less, an evaluation outcome of C or better can be given in terms of both dark current and sensitivity. When the quantum well light-receiving layer (quantum well structure 40) has a thickness of 1.5 μm or more and an impurity concentration (carrier concentration) of $1\times10^{15}$ cm$^{-3}$ or less, an evaluation outcome of B or better can be given in terms of both dark current and sensitivity. Furthermore, when the quantum well light-receiving layer (quantum well structure 40) has a thickness of 2.0 μm or more and an impurity concentration (carrier concentration) of $7\times10^{14}$ cm$^{-3}$ or less, an evaluation outcome of A or better can be given in terms of both dark current and sensitivity. It has been confirmed from the above experimental results that, according to the semiconductor stack and the infrared light-receiving device of this application, the sensitivity of a light-receiving device including semiconductor layers formed of a III-V compound semiconductor can be improved and the dark current can be reduced.

Example 2

An experiment was conducted to confirm an effect produced by intentionally introducing, into the quantum well light-receiving layer containing an impurity, an impurity that generates a carrier of a different conductivity type to decrease the carrier concentration. Specifically, a sample (sample B) was produced by introducing Zn, in a concentration of $4.5\times10^{16}$ cm$^{-3}$, into the quantum well light-receiving layer (quantum well structure 40) of the sample (sample A) produced in Example 1 and having an impurity (Si) concentration of $5\times10^{16}$ cm$^{-3}$ and a thickness of 1.5 μm, so as to have a decreased carrier concentration of $5\times10^{15}$ cm$^{-3}$. The sensitivity and dark current were measured under the same conditions as in Example 1, and the results were compared with those of the sample A. Table 2 shows the experimental results. The evaluation criteria of the sensitivity and the dark current are the same as those in Example 1. In Table 2, "−" indicates that the impurity concentration was lower than or equal to the measurement limit.

TABLE 2

| | Sample A | Sample B |
|---|---|---|
| Thickness (μm) | 1.5 | 1.5 |
| Si concentration (cm$^{-3}$) | $5\times10^{16}$ | $5\times10^{16}$ |
| Zn concentration (cm$^{-3}$) | — | $4.5\times10^{16}$ |
| Carrier concentration (cm$^{-3}$) | $5\times10^{16}$ | $5\times10^{15}$ |
| Sensitivity (A/W) | 0.1 | 0.7 |
| | D | C |
| Dark current (pA) | 600 | 60 |
| | D | C |

Referring to Table 2, the sensitivity is further increased and the dark current is further reduced in the sample B into which Zn was introduced as an impurity than in the sample A. Thus, it has been confirmed that, in the case where mixing of impurities is inevitable, the sensitivity and the dark current can be improved by intentionally introducing, into the quantum well light-receiving layer containing an impurity, an impurity that generates a carrier of a different conductivity type to decrease the carrier concentration.

Example 3

An experiment was conducted to confirm effects produced by performing the additional steps in Modifications 1 to 3 of the first embodiment. Specifically, a process (sample D) of performing the coating step in Modification 1, a process (sample E) of performing the baking step (650° C., 1 hour) in Modification 2, and a process (sample F) of performing the cleaning step in Modification 3 were performed to produce infrared light-receiving devices 1. Furthermore, another infrared light-receiving device 1 (sample C, heating before formation of the buffer layer 30: 550° C., 1 hour) was produced without performing the above processes. The resulting infrared light-receiving devices 1 were compared with each other in terms of sensitivity and dark current. The Si, C, and Zn concentrations in the quantum well structure 40 were also measured for the samples C, D, E, and F. Table 3 shows the experimental results. The evaluation criteria of the sensitivity and the dark current are the same as those in Example 1. In Table 3, "−" indicates that the impurity concentration was lower than or equal to the measurement limit.

| | Sample C | Sample D | Sample E | Sample F |
|---|---|---|---|---|
| Additional step | None | Coating | Baking (650° C.) | Cleaning |
| Thickness(μm) | 2.5 | 2.5 | 2.5 | 2.5 |
| Si concentration(cm$^{-3}$) | $4\times10^{16}$ | — | — | — |
| C concentration(cm$^{-3}$) | $1\times10^{17}$ | — | — | — |
| Zn concentration(cm$^{-3}$) | $6\times10^{15}$ | — | — | — |
| Sensitivity (A/W) | 0.1 | 1.8 | 1.7 | 1.9 |
| | D | A | A | A |
| Dark current (pA) | 570 | 2.0 | 2.5 | 1.5 |
| | D | A | A | A |

Referring to Table 3, when coating, baking, and cleaning in Modifications 1 to 3 were performed under the conditions in which the infrared light-receiving device (sample C) whose evaluation outcome was D in terms of both sensitivity and dark current was produced, the sensitivity and the dark current were considerably improved. This is believed to be because the mixing of impurities such as Si, C, and Zn into the quantum well structure is suppressed by performing the additional steps. Thus, it has been confirmed that the sensitivity and the dark current can be considerably improved by performing the additional steps in Modifications 1 to 3.

Example 4

An experiment was conducted to confirm an effect produced by forming the low p-type impurity concentration region 31 in the second embodiment. Specifically, an infrared light-receiving device 1 (sample 1) having the same structure as that in the first embodiment except that the p-type impurity contained in the buffer layer 30 was C (carbon) was produced. Furthermore, samples 2 to 4 having the same structure as that in the first embodiment except that a low p-type impurity concentration region 31 was formed in the buffer layer 30 were produced. In the samples 2 to 4, the C concentration and thickness of the low p-type impurity concentration region 31 were changed as shown in Table 4. In all the samples 1 to 4, the quantum well light-receiving layer (quantum well structure 40) had a thickness of 0.6 μm and a carrier concentration of $1\times10^{16}$ cm$^{-3}$ or less. The sensitivity and dark-current density were checked for the samples 1 to 4. The sensitivity was measured by causing light having a wavelength of 2.2 μm to enter the substrate 20 at a voltage of 1.0 V at room temperature. The sample 1 exhibited a sensitivity of 0.8 A/W and a dark-current density of 2 μA/cm$^2$. Table 4 shows the experimental results of the samples 2 to 4.

TABLE 4

|  | Sample 2 | Sample 3 | Sample 4 |
|---|---|---|---|
| Concentration of low p-type impurity concentration region (cm$^{-3}$) | 5 × 10$^{18}$ | 5 × 10$^{17}$ | 5 × 10$^{17}$ |
| Thickness of low p-type impurity concentration region (nm) | 200 | 25 | 50 |
| Sensitivity (A/W) | 0.8 | 0.8 | 1.2 |
| Dark-current density (μA/cm$^2$) | 2 | 1 | 0.8 |

The sample 1 and the samples 2 to 4 (Table 4) were compared with each other. In the case where the C concentration in the low p-type impurity concentration region 31 is 5×10$^{18}$ cm$^{-3}$, which is higher than 5×10$^{17}$ cm$^{-3}$, even when the thickness is 200 nm, the effects of improving the sensitivity and reducing the dark current are not produced (sensitivity: 0.8 A/W, dark-current density: 2 μA/cm$^2$) compared with the case (sample 1) where a low p-type impurity concentration region is not formed. In the case where the thickness is 25 nm, which is less than 50 nm, even when the C concentration in the low p-type impurity concentration region 31 is 5×10$^{17}$ cm$^{-3}$, the effects of improving the sensitivity and reducing the dark current are not sufficiently produced (sensitivity: 0.8 A/W, dark-current density: 1 μA/cm$^2$). In contrast, in the case where the C concentration in the low p-type impurity concentration region 31 is 5×10$^{17}$ cm$^{-3}$ and the thickness is 50 nm, higher sensitivity and lower dark current are achieved (sensitivity: 1.2 A/W, dark-current density: 0.8 μA/cm$^2$). Thus, it has been confirmed that the sensitivity of a light-receiving device can be further improved and the dark current can be further reduced by forming a low p-type impurity concentration region 31 having a concentration of 5×10$^{17}$ cm$^{-3}$ or less and a thickness of 50 nm or more. Herein, the present inventors have confirmed that when the p-type impurity contained in the buffer layer 30 is Be, Zn, or Mg, the same tendency as that in the case where the p-type impurity is C is exhibited.

The embodiments and Examples disclosed herein are mere examples in all respects and should be understood as being non-limitative in any perspective. The scope of the present invention is defined not by the above description but by Claims. The scope of the present invention is intended to embrace all the modifications within the meaning and range of equivalency of the Claims. For example, the case where the first conductivity type is a p-type and the second conductivity type is an n-type has been mainly described in the first and third embodiments and Examples 1 to 3. However, the first conductivity type may be an n-type and the second conductivity type may be a p-type.

INDUSTRIAL APPLICABILITY

The semiconductor stack, the light-receiving device, and the method for producing a semiconductor stack according to this application are particularly advantageously applicable to a semiconductor stack, a light-receiving device, and a method for producing a semiconductor stack that are required to improve the sensitivity and reduce the dark current.

REFERENCE SIGNS LIST 1 infrared light-receiving device
10 semiconductor stack
20 substrate
20A main surface of substrate
30 buffer layer
30A first main surface of buffer layer
31 low p-type impurity concentration region
40 quantum well structure
40A main surface of quantum well structure
41 first component layer
42 second component layer
50 contact layer
50A main surface of contact layer
70 read-out integrated circuit
71 main body
72, 73 bump
75 wiring line
80 passivation layer
81 opening
82 opening
91 p-electrode
92 n-electrode
99 trench
99A side wall
99B bottom wall
100 infrared sensor

The invention claimed is:

1. A semiconductor stack comprising:
a first-conductivity-type layer of a first conductivity type, the first-conductivity-type layer being formed of a III-V compound semiconductor;
a quantum well light-receiving layer formed of a III-V compound semiconductor; and
a second-conductivity-type layer of a second conductivity type different from the first conductivity type, the second-conductivity-type layer being formed of a III-V compound semiconductor,
wherein the first-conductivity-type layer, the quantum well light-receiving layer, and the second-conductivity-type layer are stacked in this order,
the quantum well light-receiving layer has a thickness of 0.5 μM or more,
the quantum well light-receiving layer has a carrier concentration of 1×10$^{16}$ cm$^{-3}$ or less,
in the quantum well light-receiving layer, a first-conductivity-type impurity that generates a carrier of the first conductivity type and a second-conductivity-type impurity that generates a carrier of the second conductivity type each have a concentration of 1×10$^{16}$ cm$^{-3}$ or less,
the first-conductivity-type impurity is a p-type impurity, and a low p-type impurity concentration region having a p-type impurity concentration of 5×10$^{17}$ cm$^{-3}$ or less is formed in a region including a first main surface that is a main surface of the first-conductivity-type layer near the quantum well light-receiving layer, and
the low p-type impurity concentration region has a thickness of 50 nm or more.

2. The semiconductor stack according to claim 1,
wherein the quantum well light-receiving layer has a thickness of 1.5 μm or more, and
the quantum well light-receiving layer has a carrier concentration of 1×10$^{15}$ cm$^{-3}$ or less.

3. The semiconductor stack according to claim 1,
wherein the quantum well light-receiving layer has a thickness of 2.0 μm or more, and
the quantum well light-receiving layer has a carrier concentration of 7×10$^{14}$ cm$^{-3}$ or less.

4. The semiconductor stack according to claim 1, wherein in the quantum well light-receiving layer, one of a first-conductivity-type impurity that generates a carrier of the first conductivity type and a second-conductivity-type impurity that generates a carrier of the second conductivity type is contained in a concentration of more than $1\times10^{16}$ cm$^{-3}$, and the other of the first-conductivity-type impurity and the second-conductivity-type impurity is contained in such a concentration that a difference in concentration between the one and the other is $1\times10^{16}$ cm$^{-3}$ or less.

5. The semiconductor stack according to claim 1, wherein one of the first-conductivity-type impurity and the second-conductivity-type impurity is at least one selected from the group consisting of Si, S, Se, Ge, and Te, and the other is at least one selected from the group consisting of Zn, Be, Mg, and C.

6. The semiconductor stack according to claim 1, wherein the quantum well light-receiving layer has a type II quantum well structure.

7. The semiconductor stack according to claim 1, wherein the quantum well light-receiving layer has a multiple quantum well structure including pairs of In$_x$Ga$_{1-x}$As (x is 0.38 or more and 1 or less) layers and GaAs$_{1-y}$Sb$_y$ (y is 0.36 or more and 1 or less) layers or pairs of Ga$_{1-u}$In$_u$N$_v$As$_{1-v}$ (u is 0.4 or more and 0.8 or less, v is more than 0 and 0.2 or less) layers and GaAs$_{1-y}$Sb$_y$ (y is 0.36 or more and 0.62 or less) layers.

8. The semiconductor stack according to claim 7, further comprising a substrate located on an opposite side of the first-conductivity-type layer from the quantum well light-receiving layer, and
wherein the substrate is formed of GaAs, GaP, GaSb, InP, InAs, InSb, AlSb, or AlAs.

9. The semiconductor stack according to claim 1, wherein an oxygen concentration, a carbon concentration, and a hydrogen concentration at an interface between the first-conductivity-type layer and the quantum well light-receiving layer and at an interface between the quantum well light-receiving layer and the second-conductivity-type layer are each $1\times10^{17}$ cm$^{-3}$ or less.

10. A light-receiving device comprising:
the semiconductor stack according to claim 1; and
electrodes formed on the semiconductor stack.

11. A method for producing a semiconductor stack, comprising:
a step of forming a first-conductivity-type layer of a first conductivity type, the first-conductivity-type layer being formed of a III-V compound semiconductor;
a step of forming a quantum well light-receiving layer formed of a III-V compound semiconductor; and
a step of forming a second-conductivity-type layer of a second conductivity type different from the first conductivity type, the second-conductivity-type layer being formed of a III-V compound semiconductor,
wherein the step of forming a first-conductivity-type layer, the step of forming a quantum well light-receiving layer, and the step of forming a second-conductivity-type layer are performed in this order, and the first-conductivity-type layer, the quantum well light-receiving layer, and the second-conductivity-type layer are stacked in this order,
the quantum well light-receiving layer is formed so as to have a thickness of 0.5 μM or more and a carrier concentration of $1\times10^{16}$ cm$^{-3}$ or less,
in the quantum well light-receiving layer, a first-conductivity-type impurity that generates a carrier of the first conductivity type and a second-conductivity-type impurity that generates a carrier of the second conductivity type each have a concentration of $1\times10^{16}$ cm$^{-3}$ or less,
the first-conductivity-type impurity is a p-type impurity, and a low p-type impurity concentration region having a p-type impurity concentration of $5\times10^{17}$ cm$^{-3}$ or less is formed in a region including a first main surface that is a main surface of the first-conductivity-type layer near the quantum well light-receiving layer, and
the low p-type impurity concentration region has a thickness of 50 nm or more.

12. The method for producing a semiconductor stack according to claim 11, wherein the step of forming a first-conductivity-type layer, the step of forming a quantum well light-receiving layer, and the step of forming a second-conductivity-type layer are performed so that the first-conductivity-type layer, the quantum well light-receiving layer, and the second-conductivity-type layer are stacked without forming a regrowth interface.

13. The method for producing a semiconductor stack according to claim 11, wherein the step of forming a first-conductivity-type layer, the step of forming a quantum well light-receiving layer, and the step of forming a second-conductivity-type layer are performed by a metal-organic vapor phase epitaxy method.

14. The method for producing a semiconductor stack according to claim 11, further comprising, before the step of forming a quantum well light-receiving layer, a step of coating an inside of a growth chamber used for performing the step of forming a quantum well light-receiving layer.

15. The method for producing a semiconductor stack according to claim 11, further comprising, before the step of forming a quantum well light-receiving layer, a step of baking an inside of a growth chamber used for performing the step of forming a quantum well light-receiving layer by heating the inside to 600° C. or higher.

16. The method for producing a semiconductor stack according to claim 11, further comprising, before the step of forming a quantum well light-receiving layer, a step of cleaning a member disposed inside a growth chamber used for performing the step of forming a quantum well light-receiving layer.

* * * * *